(12) United States Patent
Kimura et al.

(10) Patent No.: US 8,129,277 B2
(45) Date of Patent: Mar. 6, 2012

(54) METHOD OF MACHINING WAFER

(75) Inventors: Yusuke Kimura, Ota-Ku (JP); Kuniaki Tsurushima, Ota-ku (JP)

(73) Assignee: Disco Corporation, Tokyo (JP)

( * ) Notice: Subject to any disclaimer, the term of this patent is extended or adjusted under 35 U.S.C. 154(b) by 931 days.

(21) Appl. No.: 12/141,553

(22) Filed: Jun. 18, 2008

(65) Prior Publication Data

US 2009/0004859 A1 Jan. 1, 2009

(30) Foreign Application Priority Data

Jun. 28, 2007 (JP) ................. 2007-170365

(51) Int. Cl.
*H01L 21/302* (2006.01)
*H01L 21/461* (2006.01)
*H01L 23/48* (2006.01)
*H01L 23/52* (2006.01)

(52) U.S. Cl. .................. 438/691; 216/11; 257/E21.237; 257/E21.597; 257/689; 257/737

(58) Field of Classification Search .................... 216/11; 438/691; 257/E21.237, E21.238, E21.597, 257/E21.599, 686, 689, 737, 773
See application file for complete search history.

(56) References Cited

U.S. PATENT DOCUMENTS

| 2004/0188822 A1* | 9/2004 | Hara .............................. 257/689 |
| 2006/0038300 A1* | 2/2006 | Tanida et al. .................. 257/773 |
| 2006/0292826 A1* | 12/2006 | Kajiyama et al. ............. 438/459 |
| 2007/0287265 A1* | 12/2007 | Hatano et al. ................. 438/458 |

FOREIGN PATENT DOCUMENTS

| JP | A 2005-136187 | 5/2005 |
| JP | A 2006-12889 | 1/2006 |

* cited by examiner

*Primary Examiner* — Parviz Hassanzadeh
*Assistant Examiner* — Margaret D Klunk
(74) *Attorney, Agent, or Firm* — Greer, Burns & Crain, Ltd.

(57) ABSTRACT

A method of machining a wafer in which, at the time of grinding the back-side surface of the wafer, only a back-side surface region corresponding to a device formation region where semiconductor chips are formed is thinned by grinding, to form a recessed part on the back side of the wafer. An annular projected part surrounding the recessed part is utilized to secure rigidity of the wafer. Next, the recessed part is etched to cause metallic electrodes to project from the bottom surface of the recessed part, thereby forming a back-side electrode parts, then an insulating film is formed in the recessed part, and the insulating film and end surfaces of the back-side electrode parts are cut.

1 Claim, 11 Drawing Sheets

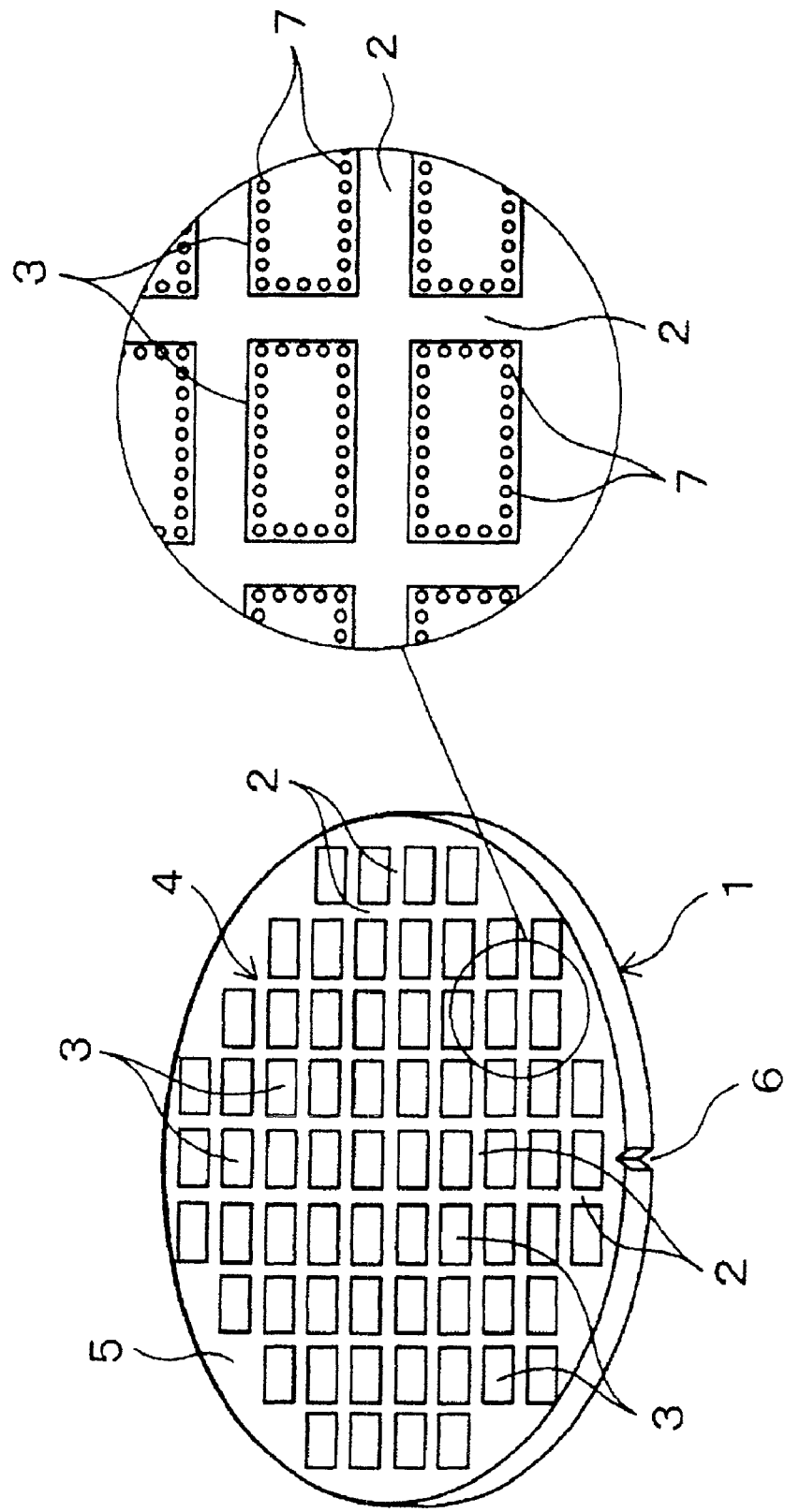

FIG.2G

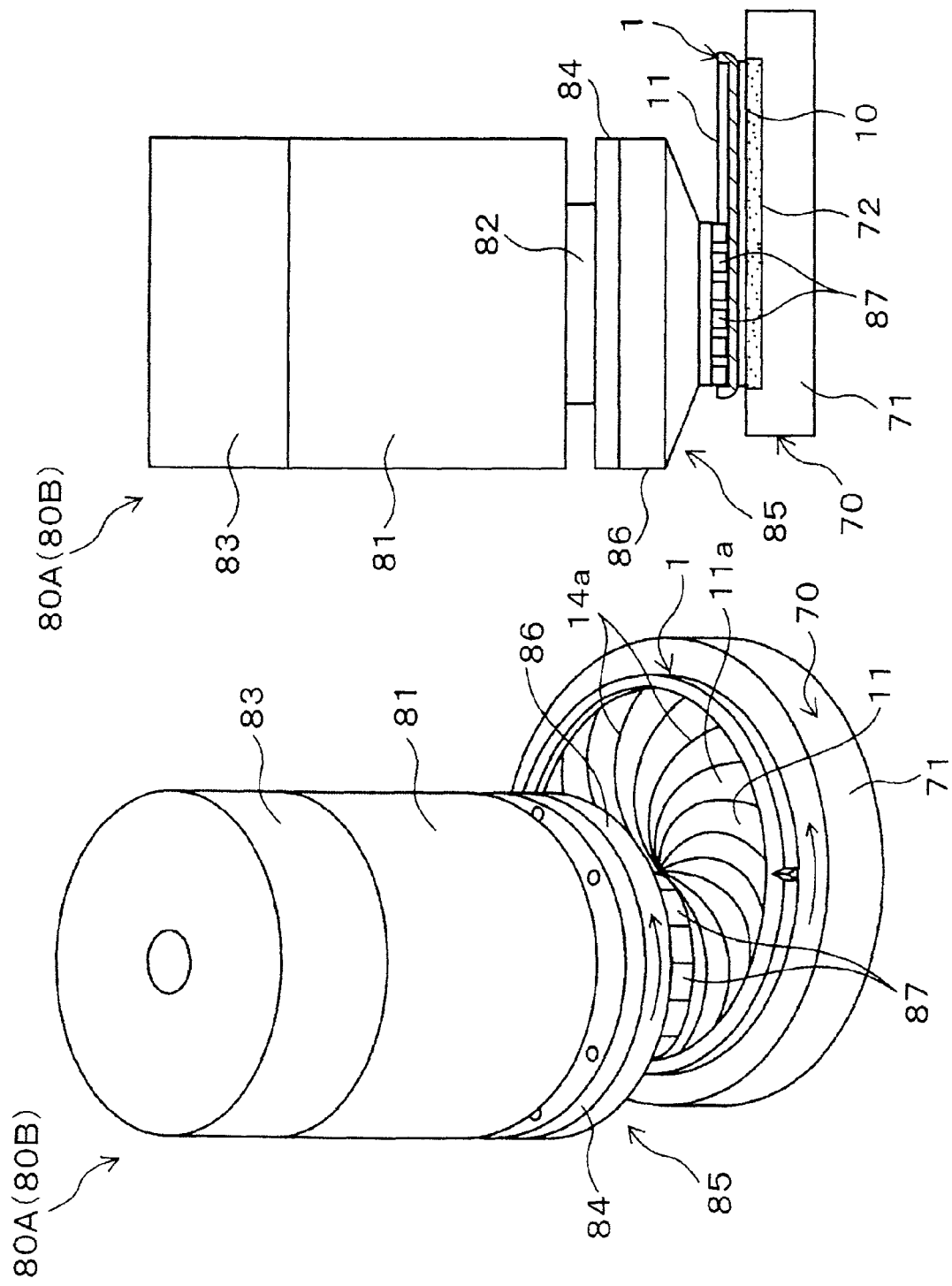

METHOD OF MACHINING WAFER

BACKGROUND OF THE INVENTION

1. Field of the Invention

The present invention relates to a method of machining a wafer in a process in which devices such as semiconductor chips provided with metallic electrodes penetrating therethrough are obtained from the wafer provided with a plurality of the devices.

2. Description of the Related Art

In the semiconductor device technology in recent years, stack type semiconductor packages in which a plurality of semiconductor chips such as MCPs (multi chip packages) and SIPs (system in packages) are stacked have been utilized effectively for achieving a higher density, a smaller size and a thinner form. Methods for manufacturing such a semiconductor package includes a method in which semiconductor chips are stacked on a package substrate called "interposer", the electrodes of the interposer and the semiconductor chips are, or the electrodes of the plurality of semiconductor chips stacked are, electrically connected through metallic wires, and then the semiconductor chips are resin molded onto the interposer.

In this method, however, the connection using the metallic wires has a problem in which the metallic wires may be deformed at the time of pouring a molding resin, to cause line breakage or short-circuit, or air remaining in the molding resin expands at the time of heating, to result in breakage. To obviate this problem, a technology has been developed in which the semiconductor chips are provided with penetrating electrodes penetrating therethrough in the thickness direction and making conduction to electrodes of their own, and, simultaneously with the stacking of the semiconductor chips, the penetrating electrodes are joined to each other to achieve the desired electrical connection (refer to Japanese Patent Laid-open No. 2005-136187 and Japanese Patent Laid-open No. 2006-012889).

In the subsequent processing of the semiconductor chips connected through the penetrating electrodes, the semiconductor wafer as an assembly yet to be split into the individual devices is thinned by grinding the back-side surface thereof, whereby the penetrating electrodes preliminarily formed correspondingly to the semiconductor chips are exposed on the back side of the wafer, and, further, the back-side surface is subjected to plasma etching or the like so that a small thickness thereof is removed, whereby the penetrating electrodes are left protruding from the back-side surface of the wafer. Such a protruding condition ensures that, at the time of stacking the semiconductor chip with a mating stacked member (a mating member to be stacked), the penetrating electrodes of the semiconductor chip can be connected to the electrodes of the mating stacked member in such a manner as to securely attain the electrical conduction. However, since the semiconductor wafer is processed to a very small thickness for reductions in size and thickness as above-mentioned, it is difficult to suitably handle the semiconductor wafer in transfer to an etching step after the thinning or in transfer to the subsequent splitting step, and the semiconductor wafer is susceptible to cracking, so that the yield thereof is lowered.

Besides, in stacking the semiconductor chip, it is needed to interpose an insulating film between the semiconductor chip and the mating stacked member exclusive of the electrodes. For this purpose, at the stage of the wafer, the back-side surface of the wafer is coated with a resin so as to bury the surroundings of the electrodes protruding on the back side of the wafer. As the resin in this case, a tacky resin for stacking and joining of a DAF (Die Attach Film) or the like, a thermoplastic resin which is not tacky at normal temperature but which becomes tacky when heated at the time of stacking, or the like resin is selected appropriately.

Japanese Patent Laid-open No. 2005-136187 above-mentioned discloses a method in which the back-side surface of a wafer is coated with a resin in such a thickness as not to cover the electrode parts, thereby forming an insulating film. However, in the case where, for example, the spin coating technique in general use as a method for forming an insulating film is adopted for forming the insulating film in this instance, the resin flows over top portions of the electrodes, resulting in that the electrodes might be covered with the resin, possibly leading to failure in conduction. Thus, the disclosed method is supposed to be impractical because it is difficult with the method to apply the resin to the back side of the wafer in a predetermined thickness in such a manner as to retain the condition where the top portions of the electrodes are exposed.

SUMMARY OF THE INVENTION

Accordingly, it is an object of the present invention to provide a method of machining a wafer by which it is possible, in a process of manufacturing a device such as a semiconductor chip having penetrating electrodes, to secure rigidity of a wafer thinned before splitting into individual devices, to facilitate handling of the thin wafer, to thereby enable smooth transfer of the wafer between processing steps, and, at the stage of wafer, to easily and securely obtain a condition where an insulating film is formed in the surroundings of top portions of the penetrating electrodes exposed on the back side, so as thereby to realize enhanced productivity and yield.

In accordance with an aspect of the present invention, there is provided a method of machining a wafer having a substantially circular device formation region provided with a plurality of devices on a face-side surface thereof, and an outer peripheral marginal region surrounding the device formation region, the device formation region being provided with a plurality of metallic electrodes buried from face-side surfaces of devices to a depth of not less than the device thickness. The method includes: a protective tape adhering step of adhering a protective tape to the face side of the wafer; and a back side recessed part forming step of thinning by grinding only a region, corresponding to the device formation region, of a back-side surface of the wafer so as to form a substantially circular recessed part on the back side and to form an annular projected part projected to the back side in the outer peripheral marginal region. The method further includes: an etching step of etching the recessed part so as to remove mechanical damages given to the recessed part by the grinding and to cause the metallic electrodes thus exposed to project from a bottom surface of the recessed part, thereby forming back-side electrode parts; an insulating film forming step of coating the recessed part with a resin so as to form an insulating film; and a back side recessed part cutting step of flattening, by cutting with a cutting tool, the insulating film and the back-side electrode parts projecting from the bottom surface of the recessed part.

According to the present invention, in the back side recessed part forming step, the back-side surface portion corresponding only to the device formation region needing thinning is thinned by grinding, whereas the surrounding outer peripheral marginal region is left in its original thickness so as to form the annular projected part, to thereby obtain a wafer which has been thinned and yet the rigidity of which is secured with the annular projected part. Therefore, the transferring of the wafer between processing steps after the back side recessed part forming step and the handling of the wafer in the processing steps themselves are rendered safe and easy, and a lowering in the yield due to cracking of the wafer can be prevented from occurring. In addition, the wafer after completion of the back side recessed part cutting step conducted as the final step in the method according to the present invention is transferred to a splitting step for splitting the wafer into individual devices, and the wafer transferring and splitting operations in this process can also be progressed safely and easily, resulting in enhanced productivity and yield of the device.

In the present invention, the back side electrode parts are formed by causing the metallic electrodes to project from the bottom surface of the recessed part on the back side of the wafer in the etching step, whereby the metallic electrodes are made to constitute penetrating electrodes. Then, the recessed part is coated with the resin in the subsequent insulating film forming step to form the insulating film, and thereafter the insulating film and the back side electrodes are flattened by cutting, whereby a condition is obtained on the back side of the wafer in which the insulating film is formed in the surroundings of the top portions of the penetrating electrodes. According to the present invention, not only the resin is applied to the back side on which the penetrating electrodes (back side electrode parts) are projecting, but also the resin is flattened by cutting together with the back side electrode parts after the application of the resin. Therefore, the back side electrode parts are securely exposed, and the insulating film is formed in the surroundings of the back side electrode parts so as to be flush with the latter, resulting in that defective conduction can be prevented from occurring upon mounting of each of the devices.

For the cutting conducted in the back side recessed part cutting step in the present invention, there is adopted the so-called infeed cutting in which a cutting tool in rotation is made to act on a surface to be cut of a wafer while the wafer is revolving about its own center. To be more specific, while rotating the wafer with the center of the recessed part as a rotational axis, a cutting tool having a rotational axis parallel to the rotational axis of the wafer and having a rotational locus substantially equal to the radius of the recessed part is so positioned that the rotational locus coincides with the center of the recessed part, and, while rotating the wafer and the cutting tool, the cutting tool is pressed against the insulating film and the back-side electrode parts so as to achieve the cutting.

According to the present invention, the thinning of the wafer by grinding the back-side surface is applied only to the region corresponding to the device formation region so as to form the surrounding outer peripheral marginal region into the thick annular projected part, whereby rigidity of the wafer can be secured, resulting in that the thin wafer can be easily handled and can be smoothly transferred between processing steps. In addition, it is possible to assuredly form the wafer back side in the condition in which the insulating film is formed in the surroundings of the top portions of the back-side electrode parts exposed. As a result of the foregoing, an enhancing effect on the productivity and the yield is promised.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is a perspective view of a wafer to be machined by a method according to an embodiment of the present invention, in which the enlarged part shows the condition where bumps are projected on the surfaces of semiconductor chips;

FIGS. 2A to 2G are sectional views illustrating the method of machining a wafer according to the embodiment of the invention;

FIG. 7A is a perspective view of a grinding unit of the grinding apparatus;

FIG. 7B is a side view of the same;

DETAILED DESCRIPTION OF THE PREFERRED EMBODIMENTS

Figure 2A:
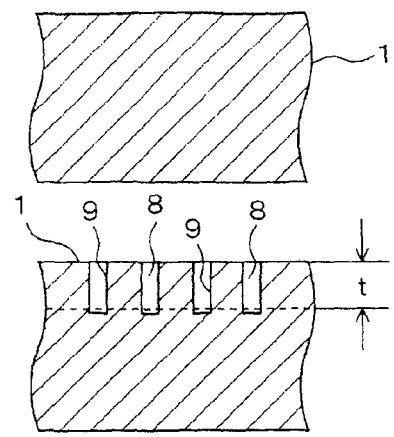

Now, an embodiment of the present invention will be described below, referring to the drawings.

[1] Semiconductor Wafer

In FIG. 1, symbol 1 denotes a circular disk-shaped semiconductor wafer which is a material for semiconductor chips. The wafer 1 is a silicon wafer or the like having a thickness of, for example, about 600 µm. In the face-side surface of the wafer 1, a plurality of rectangular semiconductor chips (devices) 3 are demarcated by planned dividing lines 2 formed in a grid pattern. The semiconductor chips 3 are provided on the face side thereof with electronic circuits (not shown) such as ICs and LSIs.

Figure 2B:
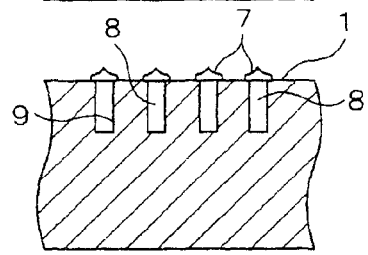
Figure 2C:
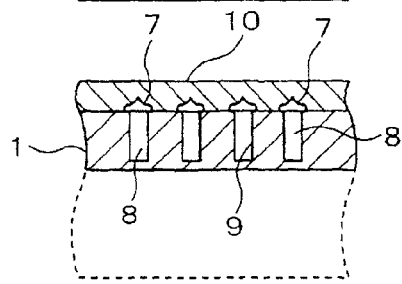

The plurality of semiconductor chips 3 are formed in a substantially circular device formation region 4 concentric with the wafer 1. The device formation region 4 occupies most part of the wafer 1, and an outer peripheral part of the wafer 1 which surrounds the device formation region 4 is made to be an annular outer peripheral marginal region 5 in which no semiconductor chip 3 is formed. In addition, the circumferential surface of the wafer 1 is provided at a predetermined position with a V-shaped notch 6 indicative of the crystal orientation of the semiconductor. The notch 6 is formed in the outer peripheral marginal region 5. As shown in the enlarged view on the right side in FIG. 1, a plurality of bumps 7 are formed on the face-side surface of each of the semiconductor chips 3. The bumps 7 are each a projected electrode part for external connection, and, as shown in FIG. 2C, the bumps 7 are formed at the tips of metallic electrodes 8 in electrical connection with electrode parts inside the semiconductor chip 3.

Now, description will be made of the method of machining a wafer, ranging from the step of providing the wafer 1 with the metallic electrodes 8 and the bumps 7, through the step of thinning the wafer and the step of exposing end parts of the metallic electrodes 8 on the back side of the wafer 1 so as to form penetrating electrodes, to the step of forming an insulating film in the surroundings of the penetrating electrodes.

[2] Formation of Metallic Electrodes and Bumps

The metallic electrodes 8 and the bumps 7 are formed as follows. First, in the face-side surface of the wafer 1 shown in FIG. 2A, a plurality of metallic electrodes 8 are buried as shown in FIG. 2B. The metallic electrodes 8 are substantially flush with the face-side surface of the wafer 1, and are formed to a depth which is slightly greater than the thickness t of the semiconductor chips 3. The metallic electrodes 8 are formed by forming an insulating film on the inside surfaces of via holes 9 bored in the face-side surface of the wafer 1, and filling up the via holes 9 with an electrode metal such as copper. The via holes 9 are formed, for example, by a method in which the face-side surface of the wafer 1 provided thereon with a resist pattern as a mask is subjected to plasma etching. The metallic electrodes 8 are formed in the via holes 9 by a CVD method or the like.

Figure 3A:
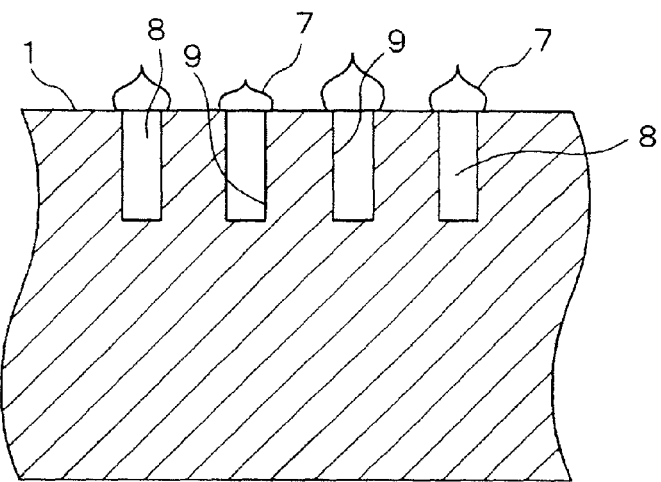
FIGS. 3A to 3C are enlarged sectional views illustrating a process of making the bumps even in height.

Next, as shown in FIG. 2C, the above-mentioned bumps 7 are deposited on the end faces of the metallic electrodes 8 exposed at the face-side surface of the wafer 1. The bumps 7 are deposited by a method in which a molten metal is brought into contact with the exposed end faces of the metallic electrodes 8. Therefore, the tips of the bumps 7 are pointed and they are uneven in height, as shown in FIG. 3A. After the bumps 7 are deposited on the metallic electrodes 8, the tips of the bumps 7 are uniformly cut so as to be even in height.

Figure 4:
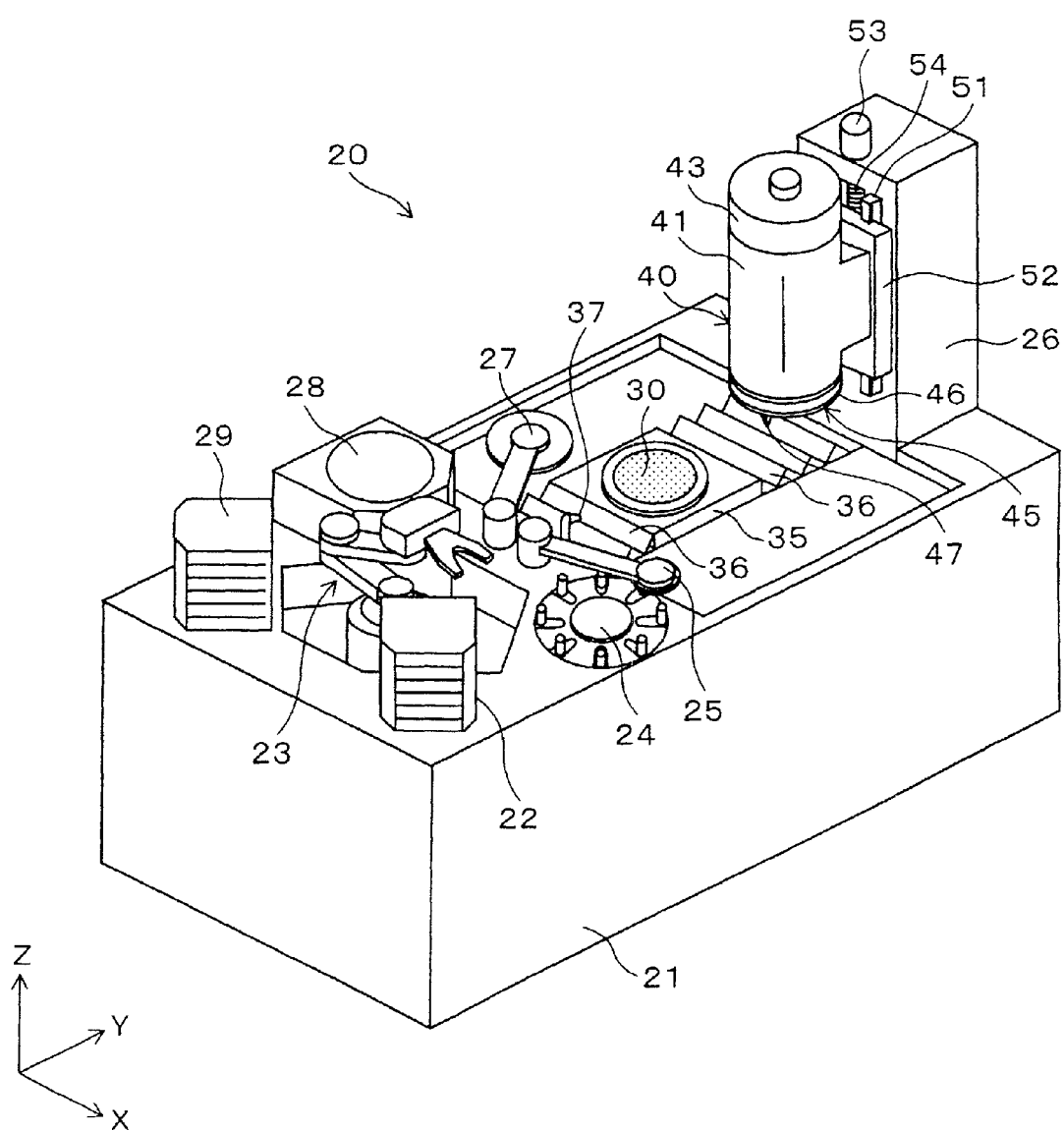
FIG. 4 is a perspective view of a cutting apparatus for carrying out preferably the cutting of the bumps on the face side of the wafer and a recessed part on the back side of the wafer.

For cutting the tips of the bumps 7 so as to make them even in height, a cutting apparatus 20 shown in FIG. 4 is preferably used. According to the cutting apparatus 20, the back side of the wafer 1 is held by suction onto a suction surface of a vacuum chuck type chuck table 30, and the tips of the bumps 7 are cut by a cutting tool 47 of a cutting unit 40 being rotated, whereby the bumps 7 are made to be even in height.

The configuration and operation of the cutting apparatus 20 are as follows. The cutting apparatus 20 has a rectangular parallelopiped base 21, and a plurality of wafers 1 are stored in stack in a supply cassette 22 detachably set at a predetermined position on the base 21, with their face side (on which the bumps 7 are projected) up. One of the wafers 1 is drawn out of the supply cassette 22 by a feeding robot 23, the wafer 1 is mounted on a positioning table 24, with its face side up, and the wafer 1 is positioned in a predetermined position on the table 24. The wafer 1 thus positioned on the positioning table 24 is taken up from the positioning table 24 by a supply arm 25, and is held by suction onto a circular disk-shaped chuck table 30 being in vacuum operation, with its back side down and with its face side (on which the bumps 7 are projected) exposed.

As shown in FIG. 4, the chuck table 30 is supported on a table base 35, provided to be movable in a Y direction on the base 21, so as to be rotatable about a rotational axis set in a Z direction (vertical direction), and is rotationally driven by a driving mechanism (not shown). The wafer 1 held on the chuck table 30 is fed into a machining position on the depth side in the Y direction through the table base 35 and the chuck table 30. A cutting unit 40 for cutting the bumps 7 is disposed on the upper side of the machining position. On the base 21, a bellows-like cover 36 for closing a moving path of the table base 35 so as to prevent cuttings and the like from dropping into the base 21 is provided so that it can be contracted and expanded.

The cutting unit 40 is disposed on the front side of a column 26 erectly provided at an end part on the depth side of the base 21 so that the cutting unit 40 can be moved up and down along the Z direction. Specifically, a guide 51 extending in the Z direction is provided on a front surface of the column 26, and the cutting unit 40 is slidably mounted to the guide 51 through a slider 52. The cutting unit 40 is moved up and down by way of the slider 52, by a ball screw type feeding mechanism 54 driven by a servo motor 53.

The cutting unit 40 has a configuration in which a spindle shaft (not shown) is coaxially and rotatably supported in a cylindrical spindle housing 41 having an axis extending in the Z direction, and the spindle shaft is rotationally driven by a spindle motor 43 fixed to an upper end part of the spindle housing 41. A cutting implement 45 having a cutting tool 47 fixed to a lower surface of an annular frame 46 is attached to the lower end of the spindle shaft. The cutting tool 47 is provided in the condition where a cutting edge part composed of diamond or the like and provided at the tip of the cutting tool 47 is directed downward. The cutting implement 45 is rotated as one body with the spindle shaft, and the cutting outer diameter which is the rotational locus of the cutting tool 47 put into rotation is set to be greater than the diameter of the wafer 1.

For cutting the tips of the bumps 7 of the wafer 1, the cutting unit 40 is lowered by the feeding mechanism 54, the cutting edge height of the cutting tool 47 is adjusted to such a position that the heights of all the bumps 7 after cutting will be a predetermined value (for example, a value in the range of 50 to 100 µm), and, further, the cutting implement 45 is rotated by the spindle motor 43. Then, the table base 35 is moved toward the depth side so that the wafer 1 is gradually moved toward a machining position which is on the lower side of the cutting unit 40. In this instance, the chuck table 30 is not rotated but is kept stationary in a predetermined position. Then, the tips of the bumps 7 are gradually cut by the cutting tool 47 of the cutting implement 45, and, with the wafer 1 moved until covered by the cutting implement 45, the tips of all the bumps 7 are cut to be even in height.

Figure 3B:
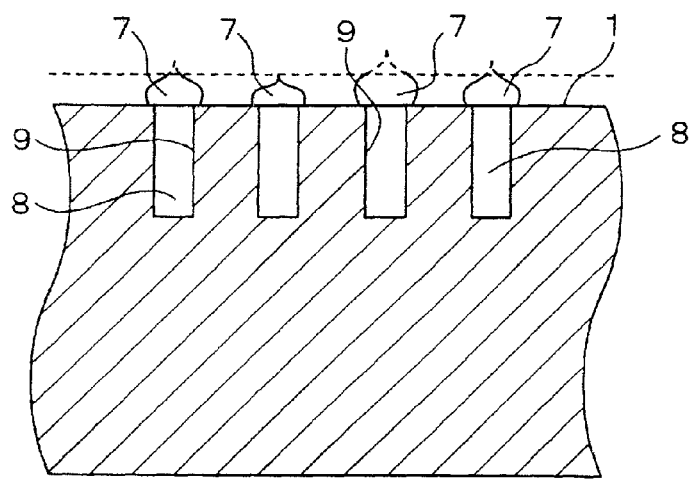
Figure 3C:
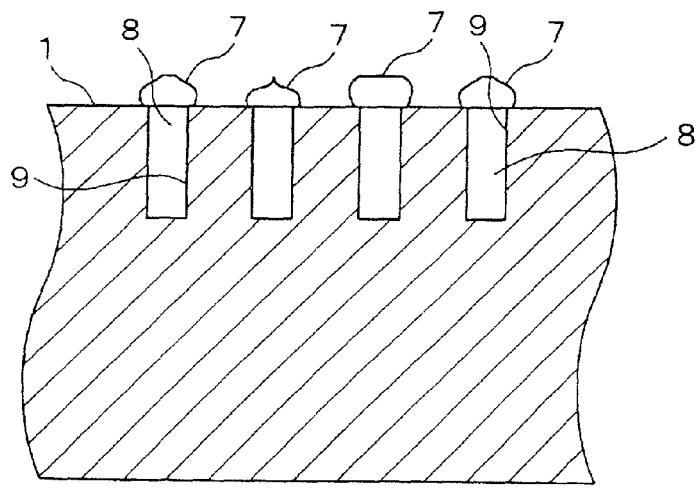

After the tips of all the bumps 7 are cut, the cutting unit 40 is raised to retract from the wafer 1, and, on the other hand, the table base 35 is moved toward the viewer's side, back to the loading/unloading position where the wafer 1 has been mounted from the supply arm 25 onto the chuck table 30. At the loading/unloading position, the vacuum operation of the chuck table 30 is stopped. Then, the wafer 1 is fed by a recovery arm 27 to a spinner type washer 28, where it is subjected to washing and drying treatments. Thereafter, the wafer 1 is fed to and contained into a recovery cassette 29 by the feeding robot 23. In addition, the chuck table 30 from which the wafer 1 has been removed is deprived of the cuttings and the like by air jetted from an air nozzle 37. FIGS. 3A to 3C illustrate the process in which the tips of the bumps 7 being uneven in height are cut by the cutting unit 20 so as to be even in height. The broken line in FIG. 3B indicates the plane of cutting by the cutting tool 47 in rotation, and the heights of the bumps 7 are evenly adjusted to the height of the plane of cutting.

[3] Protective Tape Adhering Step

Figure 5A:
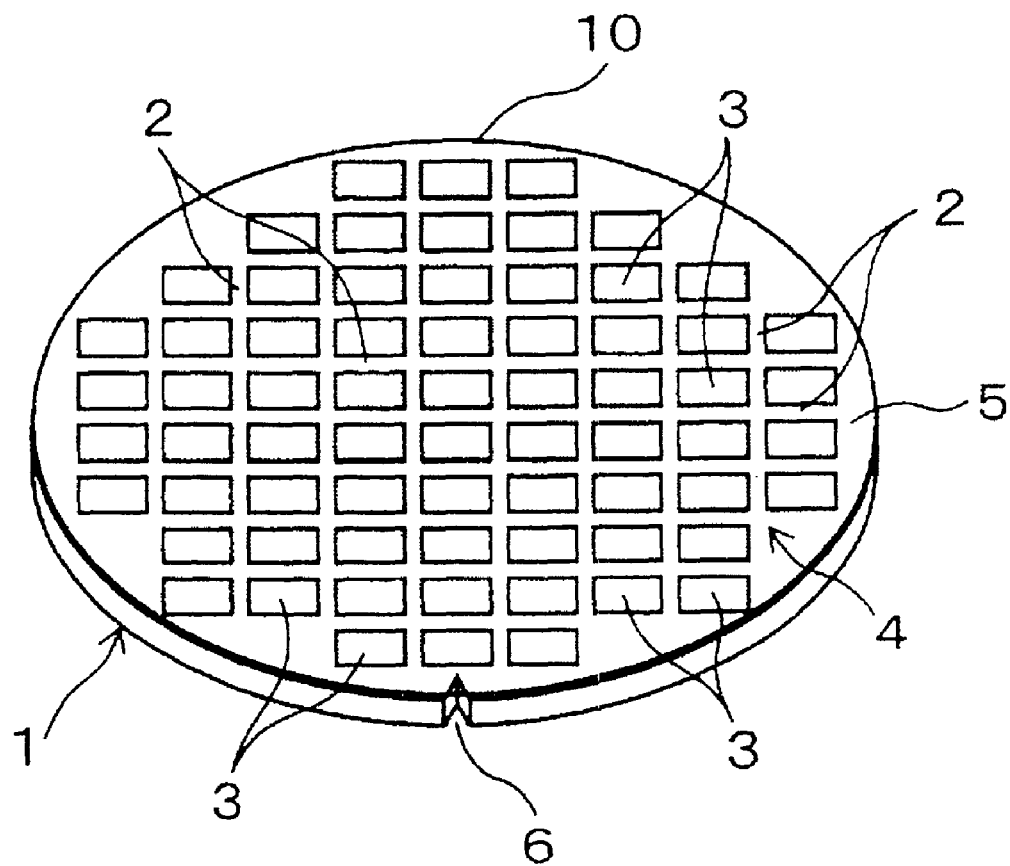
FIG. 5A is a perspective view of a wafer with a protective tape adhered to a face-side surface thereof in a protective tape adhering step.
Figure 5B:
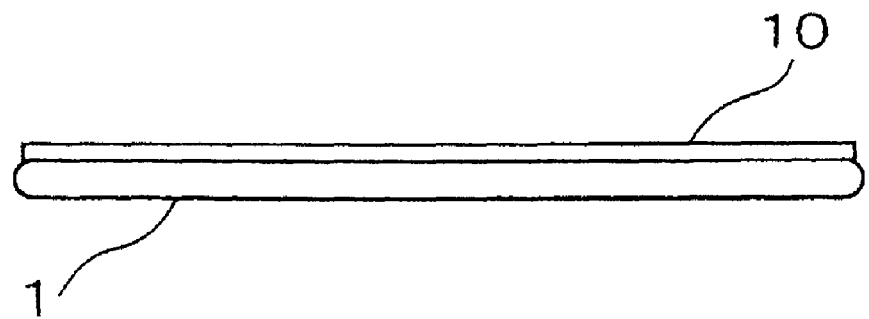
FIG. 5B is a side view of the same.

The wafer 1 with the bumps 7 made to be even in height by cutting the tips of all the bumps 7 as above-mentioned is then subjected to grinding of the back-side surface, by which the wafer 1 is thinned to the desired thickness, i.e., the thickness of the semiconductor chips 3 to be manufactured. For the thinning, as shown in FIGS. 5A and 5B, a protective tape 10 is preliminarily adhered to the face side of the wafer 1. As the protective tape 10, there may be appropriately used, for example, a tape in which a base material of polyethylene or the like having a thickness of about 100 to 200 μm is coated on one side thereof with an acrylic or other pressure sensitive adhesive in a thickness of about 10 to 20 μm.

The protective tape 10 is adhered to the face side of the wafer 1 for preventing the electronic circuits and the flattened bumps 7 of the semiconductor chips 3 from being damaged. In the case where the amount of protrusion of the bumps 7 from the wafer surface is comparatively large, it is desirable, for reducing the stress exerted on the bumps 7, that the base material of the protective tape 10 is thick and highly flexible and that the thickness of the pressure sensitive adhesive corresponds to the height of the bumps 7.

[4] Back Side Recessed Part Forming Step

Figure 2D:
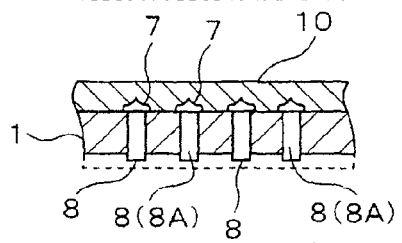
Figure 8B:
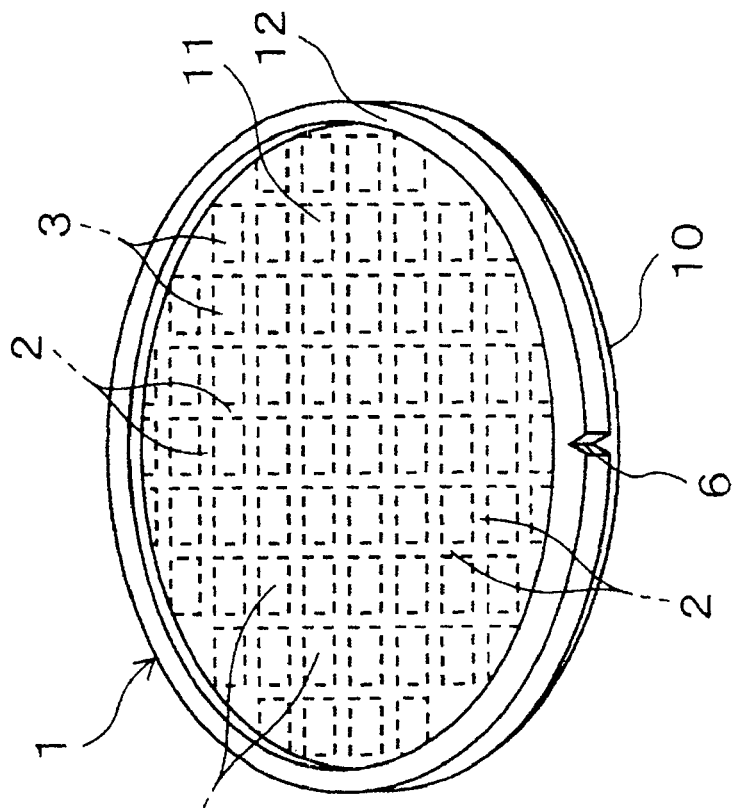
FIG. 8B is a perspective view of the wafer back-side surface after etching.
Figure 8A:
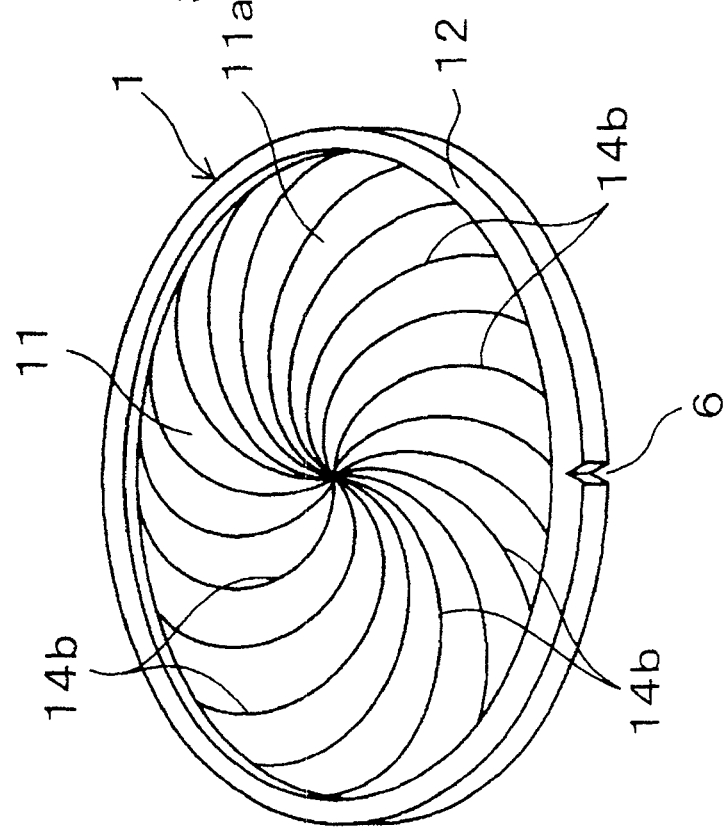
FIG. 8A is a perspective view of the wafer back-side surface provided with a recessed part, after finish grinding.

The grinding of the back-side surface of the wafer 1 is not applied to the whole area of the back-side surface but applied only to the region corresponding to the device formation region 4. Therefore, on the back side of the wafer 1, as shown in FIGS. 8A and 8B, a recessed part 11 consisting of recessing of the device formation region 4 is formed, and, at the same time, an annular projected part 12 where the original wafer thickness is retained is formed in an outer peripheral marginal region 5 surrounding the recessed part 11. As shown in FIG. 2D, the amount of grinding of the back-side surface of the wafer 1 is set at such a level that the grinding does not reach the lower ends (the end parts on the back side of the wafer) of the metallic electrodes 8 and that a slight thickness is left between the lower ends of the metallic electrodes 8 and the back-side surface of the wafer 1 thus ground. In other words, at this stage, the metallic electrodes 8 are not exposed on the back side of the wafer 1.

Figure 6:
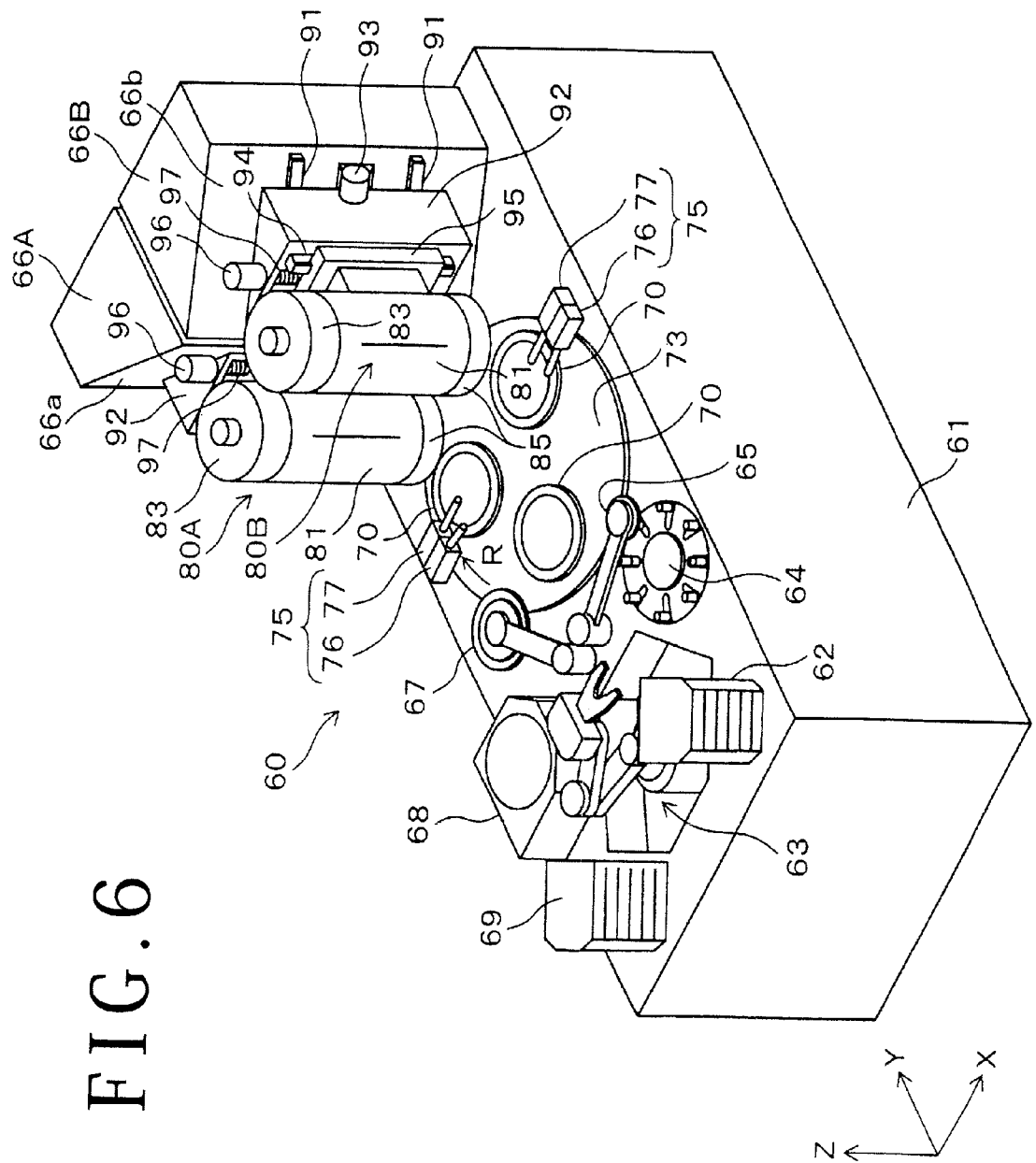
FIG. 6 is a perspective view of a grinding apparatus used in a back side recessed part forming step.

In order to thin the wafer 1 by grinding only that region of the back-side surface of the wafer 1 which corresponds to the device formation region 4 so as to form the recessed part 11 on the back side, infeed grinding by use of a grinding apparatus 60 shown in FIG. 6 is preferably adopted. According to the grinding apparatus 60, the face side of the wafer 1 provided with the bumps 7 is sucked onto a suction surface of a vacuum chuck type chuck table 70 to thereby hold the wafer 1, and rough grinding and finish grinding are sequentially applied to the back-side surface of the wafer 1 by use of two grinding unit (for rough grinding and for finish grinding) 80A and 80B.

The configuration and operation of the grinding apparatus 60 are as follows. The grinding apparatus 60 has a rectangular parallelopiped base 61, and a plurality of wafers 1 are stacked and contained, with their face side up, in a supply cassette 62 detachably set in a predetermined position on the base 61. One of the wafers 1 is drawn out of the supply cassette 62 by a feeding robot 63, the wafer 1 is inverted face side back to have its back side up, and the wafer 1 in this condition is mounted on a positioning table 64, where it is positioned into a specified position.

A turntable 73 driven to rotate in an R direction is provided on the base 61, and, at an outer peripheral part of the turntable 73, a plurality of (in this case, three) circular disk-shaped chuck tables 70 are disposed at regular intervals along the circumferential direction of the turntable 73. Each of the chuck tables 70 is supported to be rotatable about a rotational axis set in the Z direction (vertical direction), and is driven to rotate by a driving mechanism (not shown).

The wafer 1 positioned on the positioning table 64 is taken up from the positioning table 64 by a supply arm 65, and is mounted concentrically on one of the chuck tables 70 being in vacuum operation, in such a condition that its face side with the protective tape 10 adhered thereto is directed downward. As shown in FIG. 7B, the chuck table 70 has a configuration in which a circular suction part 72 composed of a porous member is formed at a central upper part of a frame body 71. The wafer 1 is held by suction onto the upper surface of the suction part 72 in such a condition that the protective tape 10 is put in secure contact with the upper surface and the back-side surface of the wafer 1 is exposed.

With the turntable 73 rotated by a predetermined angle in the R direction, the wafer 1 held on the chuck table 70 is fed into a primary machining position on the lower side of the grinding unit 80A for rough grinding, and rough grinding of the back-side surface of the wafer 1 is conducted by the grinding unit 80A in this position. Next, with the turntable 73 rotated again by a predetermined angle in the R direction, the wafer 1 is fed into a secondary machining position on the lower side of the grinding unit 80B for finish grinding, and finish grinding of the back-side surface of the wafer 1 is conducted by the grinding unit 80B in this position.

The grinding units 80A, 80B are mounted respectively to front surfaces of columns 66A, 66B which are erectly provided at an end part on the depth side of the base 61 in the state of being arrayed side by side in the X direction. The mounting structures of the grinding units 80A, 80B in relation to the columns 66A, 66B are the same and in symmetry along the X direction. In view of this, the mounting structure will be described by taking the finish grinding side as a representative and referring to FIG. 6.

The front surface 66b of the column 66B on the finish grinding side is formed as a tapered surface which is a vertical surface in relation to the upper surface of the base 61 and which is obliquely retracted at a predetermined angle toward the depth side as one goes from the center toward an end part in the X direction. The horizontal direction, or taper direction, of the tapered surface 66b (the tapered surface 66a in the case of the column 66A on the rough grinding side) is set to be parallel to a straight line passing through the center of rotation of the chuck table 70 and the center of rotation of the turntable 73.

The tapered surface 66b (66a) is provided with an upper-lower pair of guides 91 parallel to the taper direction, and an X-axis slider 92 is slidably mounted to the guides 91. The X-axis slider 92 is reciprocated along the guides 91 by a ball screw type feeding mechanism (not shown) which is driven by a servo motor 93. The reciprocating direction of the X-axis slider 92 is parallel to the direction in which the guides 91 extend, namely, the taper direction of the tapered surface 66b (66a).

The front surface of the X-axis slider 92 is a surface along the X and Z directions, and the grinding units 80A, 80B are each disposed on the front surface so that it can be lifted up and down along the Z direction (vertical direction). The lifting structure is the same as in the case of the cutting unit 40 shown in FIG. 4; specifically, each of the grinding units 80A, 80B is slidably mounted, through a Z-axis slider 95, to guides 94 which are provided on the front surface of the X-axis slider 92 and extend in the Z direction. Each of the grinding units 80A, 80B is lifted up and down in the Z direction by a ball screw type feeding mechanism 97 driven by a servo motor 96, through the Z-axis slider 95.

The grinding units 80A, 80B are the same in basic configuration, and are distinguished by the grindstones for rough grinding and finish grinding which are attached respectively thereto. As shown in FIGS. 7A and 7B, the grinding units 80A, 80B each include a cylindrical spindle housing 81 with an axis extending in the Z direction, a spindle shaft 82 supported inside the spindle housing 81 coaxially and rotatably, a motor 83 fixed to an upper end part of the spindle housing 81 and operative to drive the spindle shaft 82 to rotate, and a circular disk-shaped flange 84 fixed coaxially to the lower end of the spindle shaft 82. A grinding wheel 85 is attached to the flange 84.

The grinding wheel 85 has a plurality of grindstones 87 arrayed annularly and attached to the lower surface of a frame 86, which is annular and the lower surface of which is conical in shape. The cutting edge constituting the lower end surface of each grindstone 87 is set to be orthogonal to the axial direction of the spindle shaft 82. As the grindstone 87, for example, a grindstone obtained by mixing diamond abrasive grains into a vitreous bonding material, molding the mixture and sintering the molded body may be used.

As the grindstones 87 attached to the grinding unit 80A for rough grinding, for example, grindstones containing comparatively coarse abrasive grains of about #320 to #400 are used. On the other hand, as the grindstones 87 attached to the grinding unit 80B for finish grinding, for example, grindstones containing comparatively fine abrasive grains of about #2000 to #8000 are used. Each of the grinding units 80A, 80B is equipped with a grinding water supply mechanism (not shown in the figure) for supplying grinding wafer for cooling and/or lubricating the grinding surface and for discharging the debris generated upon grinding.

The grinding outer diameter of the grinding wheel 85, i.e., the diameter of the outer peripheral edge of the annular array of the grindstones 87 is set to be slightly smaller than the radius of the wafer 1 and approximately equal to the radius of the device formation region 4. This dimensional setting is for ensuring that the cutting edges of the grindstones 87 pass through the center of rotation of the wafer 1 concentrically held on the chuck table 70 rotated and that the outer peripheral edges of the cutting edges coincidentally pass through the outer peripheral edge of the device formation region 4 (the boundary between the device formation region 4 and the outer peripheral marginal region 5), so as to grind only the region corresponding to the device formation region 4, whereby the recessed part 11 shown in FIGS. 8A and 8B can be formed.

As has been above-mentioned, the directions of the straight lines passing through the centers of rotation of the chuck tables 70 positioned in the primary machining position and the secondary machining position and the center of rotation of the turntable 73 (hereinafter, these directions will be referred to as inter-axis directions) are set to be respectively parallel to the taper directions of the front surfaces 66a, 66b of the columns 66A, 66B, namely, the directions in which the guides 91 extend. Besides, each of the grinding units 80A, 80B is positionally set so that the center of rotation of the grinding wheel 85 (the axis of the spindle shaft 82) thereof is present just on the inter-axis direction, namely, the straight line which passes through the center of rotation of the chuck table 70 positioned at the relevant machining position (the primary machining position for the rough grinding unit 80A, and the secondary machining position for the finish grinding unit 80B) and the center of rotation of the turntable 73. In other words, this setting ensures that when the grinding unit 80A, 80B is moved together with the X-axis slider 92 along the guides 91, the center of rotation of the grinding wheel 85 is moved along the inter-axis direction.

The wafer 1 has its back-side surface ground by the rough grinding unit 80A at the primary machining position, and by the finish grinding unit 80B at the secondary machining position. In the grinding of the back-side surface, first, the position in the inter-axis direction of the grinding unit 80A (80B) is adjusted by moving the X-axis slider 92, whereby the grinding outer diameter of the grinding wheel 85 facing the back-side surface of the wafer 1 is positioned in a recessed part forming position corresponding to the radius of the device formation region 4 of the wafer 1. The recessed part forming position is such a position that the cutting edges of the grindstones 87 pass through a point near the center of rotation of the wafer 1 and through the outer peripheral edge of the device formation region 4; in this case, the position is on the side of the outer periphery of the turntable 73 relative to the center of rotation of the wafer 1. The grinding of the back-side surface is conducted by a method in which after the grinding wheel 85 is thus held at the recessed part forming position, the chuck table 70 is rotated to revolve the wafer 1 about its own center, and, while feeding the grinding unit 80A (80B) downwards by the feeding mechanism 97, the grindstones 87 of the grinding wheel 85 in rotation are pressed against the back-side surface of the wafer 1. The rotational speed of the grinding wheel 85 is set at about 2000 to 5000 rpm.

In the rough grinding by the rough grinding unit 80A, the back-side surface of the wafer 1 is ground only in its region corresponding to the device formation region 4, whereby the ground part is made to be the recessed part 11 whereas the outer peripheral marginal region 5 in the periphery of the recessed part 11 is left in its original thickness to form the annular projected part 12, as shown in FIGS. 7A to 8B. The device formation region 4 thus ground in the rough grinding is thinned to a thickness of, for example, finished thickness plus about 20 to 40 μm. Thereafter, the residual thickness (to be ground) is ground in the finish grinding, whereby the region corresponding to the device formation region 4 of the wafer 1 is thinned to the desired (target) thickness.

In the wafer 1 after the rough grinding, as shown in FIG. 7A, grinding streaks 14a in a pattern of a multiplicity of arcs drawn radially are left in the bottom surface 11a of the recessed part 11. The grinding streaks 14a are loci of crushing by the abrasive grains present in the grindstones 87, and constitute a mechanical damage layer inclusive of microcracks. While the grinding streaks 14a formed upon the rough grinding are removed by the finish grinding, the finish grinding leaves new grinding steaks 14b in the bottom surface 11a of the recessed part 11, as shown in FIG. 8A.

Incidentally, in the grinding of the back-side surface of the wafer 1, both in the rough grinding and in the finish grinding, the wafer thickness is measured by a thickness measuring gauge 75 provided in the vicinity of the relevant machining position, and the grinding amount is controlled based on the measured thickness. The thickness measuring gauge 75 is a combination of a reference-side height gauge 76 having a probe making contact with the upper surface of the frame body 71 of the chuck table 70, and a movable-side height gauge 77 having a probe making contact with the work surface (in this case, the bottom surface 11a of the recessed part 11 of the wafer 1), and the thickness of the wafer 1 having the back-side surface being ground is successively measured by comparing the height values measured by both the height gauges 76, 77. The grinding of the back-side surface of the wafer 1 is conducted while measuring the thickness of the wafer 1 by the thickness measuring gauge 75, and the amount of feeding of the grinding wheel 85 by the feeding mechanism 97 is controlled based on the measured thickness.

When the device formation region 4 of the wafer 1 is thinned to the desired thickness through the rough grinding and the finish grinding, recovery of the wafer 1 is started as follows. First, the finish grinding unit 80B is raised to retract from the wafer 1, and, on the other hand, the turntable 73 is rotated by a predetermined angle in the R direction, whereby the wafer 1 is returned to the loading/unloading position where it has been mounted from the supply arm 65 onto the chuck table 70. At the loading/unloading position, the vacuum operation of the chuck table 70 is stopped. Next, the wafer 1 is fed by a recovery arm 67 to a spinner type washer 68, where it is subjected to washing and drying treatments. Thereafter, the wafer 1 is fed to and contained into a recovery cassette 69 by the feeding robot 63.

[5] Etching Step

Figure 2E:
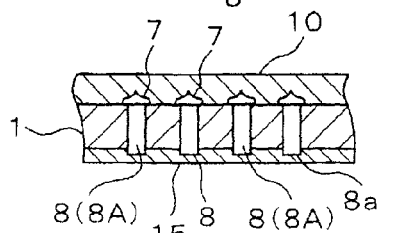

After the recessed part 11 is formed on the back side of the wafer 1 to thin only the region corresponding to the device formation region 4 to the desired thickness in the above-described manner, the recessed part 11 thus formed is then subjected to etching to remove the bottom surface 11a of the recessed part 11 by a small thickness, whereby the metallic electrodes 8 are protruded to the back side to form penetrating electrodes 8A, and back-side electrode parts 8a are formed, as shown in FIG. 2E. The protrusion amount of the back-side electrode parts 8a is set to about 5 μm, for example. As the method for etching, there is desirably adopted plasma etching conducted by use of a gas which ensures that the wafer material such as silicon is removed through reaction with the gas whereas the metallic electrodes 8 (penetrating electrodes 8A) do not react with the gas and are therefore not removed.

The plasma etching is carried out by a process in which a generally known silicon etching gas (e.g., a fluorine-based gas such as CF4 and SF6) atmosphere is established in a vessel containing the wafer 1, and plasma discharge is effected. In performing the plasma etching, the protective tape 10 may be left adhered to the face side of the wafer 1 if the protective tape 10 is sufficiently heat-resistant. If the protective tape 10 is not sufficiently heat-resistant, however, it is peeled off in advance.

Figure 9:
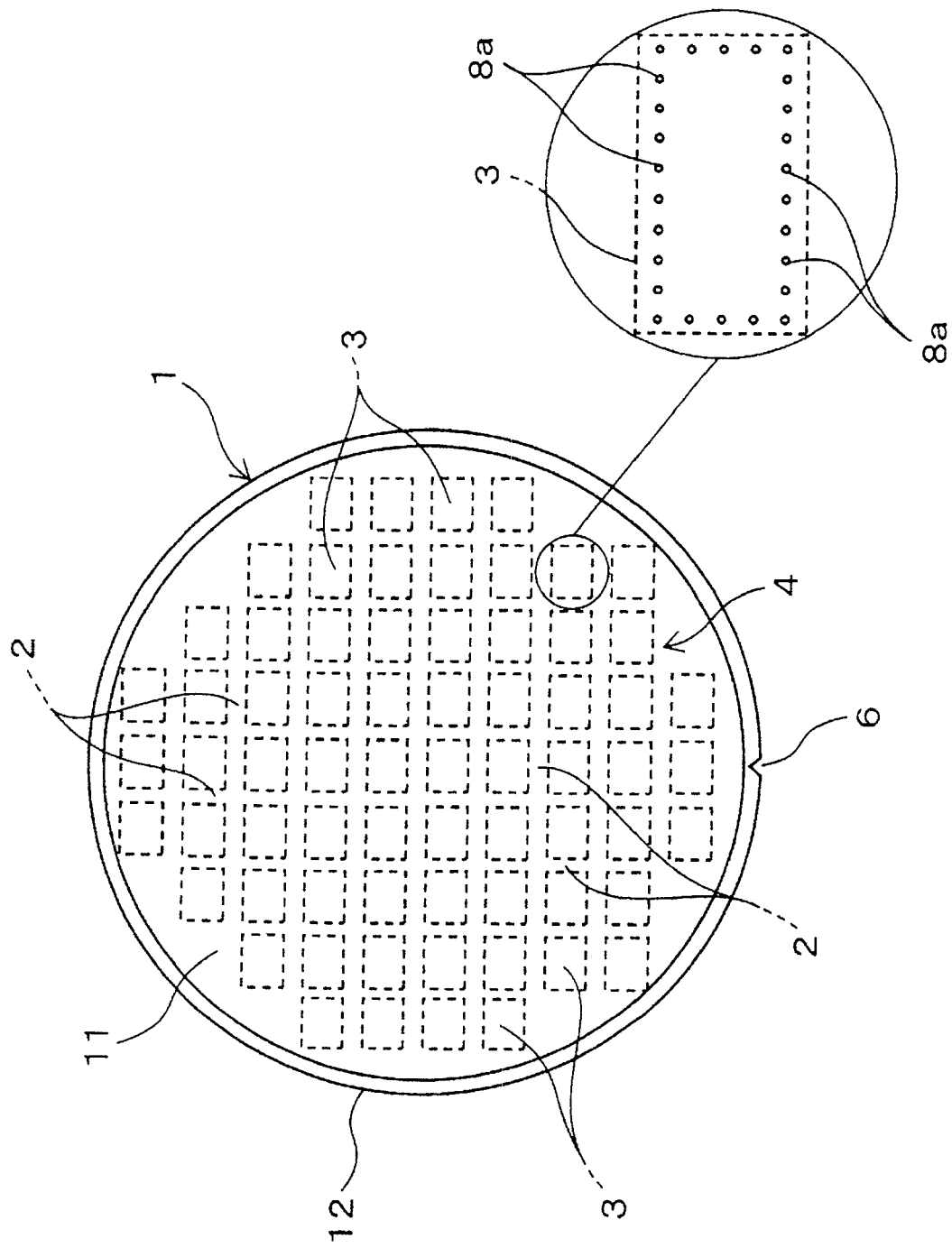
FIG. 9 is a plan view showing the back side of the wafer having been subjected to the etching step, in which the enlarged part shows the condition where metallic electrodes (back-side electrode parts) projected on face-side surfaces of semiconductor chips.
Figure 10A:
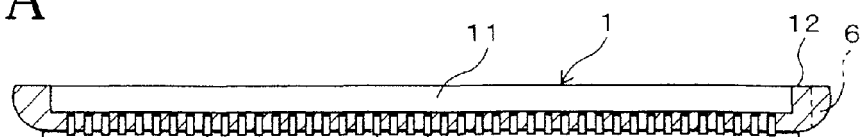
FIGS. 10A to 10D are sectional views of the wafer, showing the process from the back side recessed part forming step to a back side recessed part cutting step.
Figure 10B:
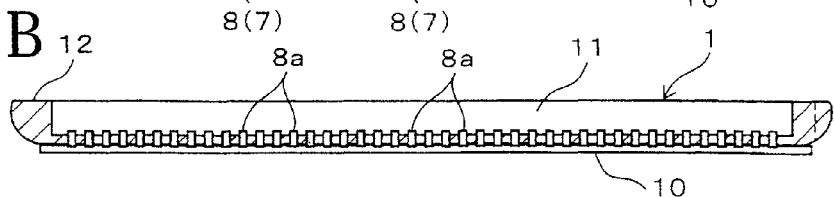

By such an etching, it is ensured that the penetrating electrodes 8A protrude from the bottom surface 11a of the recessed part 11 of the wafer 1 to constitute the back-side electrode parts 8a, as shown in FIGS. 8B and 9; in addition, even after the finish grinding, the mechanical damage layer attendant on the grinding streaks 14b remaining in the back-side surface is removed. The mechanical damage layer, if remaining, would cause concentration of stress, leading to cracking or breakage. Possibility of such troubles is reduced by the removal of the mechanical damage layer, and the wafer 1 or the individual semiconductor chips 3 produced therefrom show enhanced strength. FIGS. 10A and 10B illustrate a process in which the recessed part 11 of the wafer 1 obtained through the back side recessed part forming step is etched so as to form the back-side electrode parts 8a. Incidentally, the etching for protruding the metallic electrodes 8 on the wafer back side and for removing the grinding streaks 14b from the bottom surface 11a of the recessed part 11 is not limited to the above-mentioned plasma etching, and generally known wet etching can also be adopted.

[6] Insulating Film Forming Step

Figure 2F:
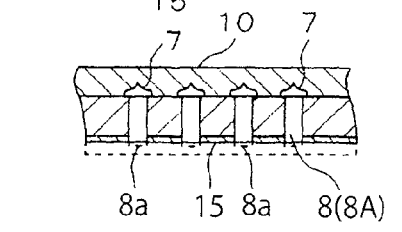
Figure 10C:
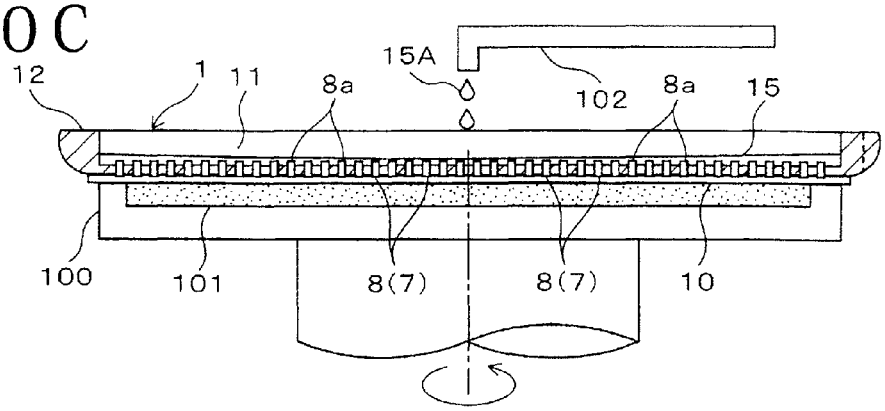

Next, as shown in FIG. 2F, an insulating film 15 in such a thickness as to cover the back-side electrode parts 8a is formed on the bottom surface 11a of the recessed part 11. The insulating film 15 can be suitably formed by a spin coating method in which, as shown in FIG. 10C, the wafer 1 held by suction onto a circular disk-shaped spinning table 100 having a circular suction part 101 composed of a porous member, with its recessed part 11 up, and, while rotating the spinning table 100, a liquid insulating resin 15A is dropped from a nozzle 102 onto the center of rotation in the recessed part 11. The resin 15A dropped into the recessed part 11 flows from the center of the recessed part 11 toward the outer periphery under a centrifugal force, whereby the bottom surface 11a of the recessed part 11 is covered with the resin 15A, and then the resin 15A cures to form the insulating film 15. As the resin 15A in this case, a polyimide resin or an epoxy resin or the like is appropriately used, and it is cured through a curing process according to the kind thereof.

[7] Back Side Recessed Part Cutting Step

Subsequently, as shown in FIG. 2G, the insulating film 15 formed in the recessed part 11 on the back side of the wafer 1 and the tips of the back-side electrode parts 8a covered with the insulating film 15 are collectively cut so that the bottom surface 11a of the recessed part 11 is machined to be parallel to the face-side surface of the wafer 1 and be flat. The cutting of the back-side recessed part is preferably carried out by infeed cutting performed by use of the cutting apparatus 20 shown in FIG. 4, which has been used for cutting the tips of the bumps 7 to render the bumps 7 even in height.

Figure 10D:
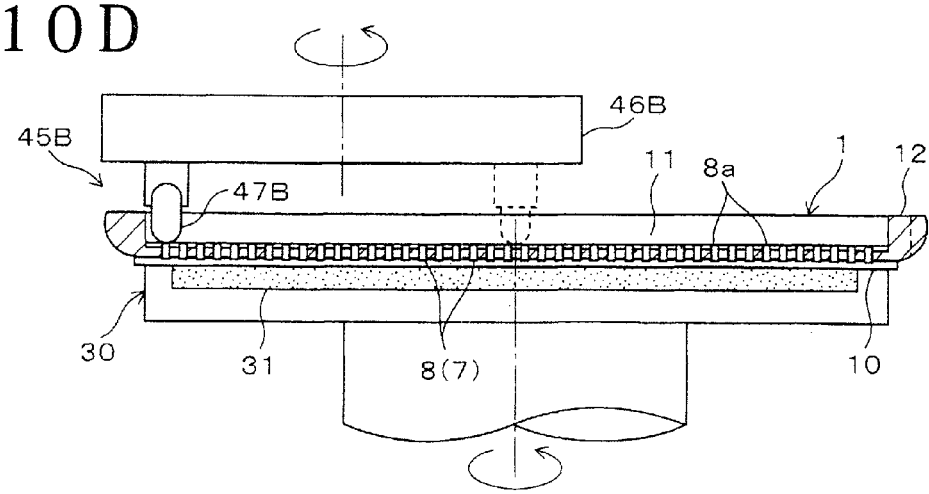

The cutting outer diameter of the cutting implement 45 used in cutting the bumps 7 (the circular locus of rotation of the cutting tool 47 rotated) is larger than the diameter of the wafer 1; therefore, it is impossible with this cutting implement 45 to cut only the recessed part 11. As shown in FIG. 10D, a cutting implement 45B used in this step has a cutting tool 47B fixed to the lower surface of a frame 46B in the same manner as above-mentioned, but the diameter of the frame 46B is set to be slightly larger than the radius of the wafer 1, and the outer diameter of cutting by the cutting tool 47B is set to be equal to or slightly smaller than the radius of the recessed part 11. The cutting implement 45B is set on the cutting unit 40 by attaching the frame 46B to the lower end of the spindle shaft of the cutting unit 40.

In cutting the recessed part 11 on the wafer back side, as shown in FIG. 10D, the wafer 1 is held by suction concentrically onto the chuck table 30, with the recessed part 11 up, and in the condition where the protective tape 10 adhered to the face side of the wafer 1 is in secure contact with the suction part 31 of the chuck table 30. Then, the table base 35 shown in FIG. 4 is moved in the Y direction so that the position of the wafer 1 opposed to the cutting implement 45B is positioned at a recessed part cutting position such that the cutting outer diameter of the cutting tool 47B corresponds to the radius of the recessed part 11. The recessed part cutting position is such a position that the cutting edge of the cutting tool 47B passes through the vicinity of the center of rotation of the wafer 1 and through the vicinity of the outer peripheral edge of the recessed part 11.

The cutting of the recessed part 11 is conducted by a process in which, after the cutting implement 45B is thus held at the recessed part cutting position, the chuck table 30 is rotated to revolve the wafer 1 about its own center, and, while feeding the cutting unit 40 downwards by the feeding mechanism 54, the cutting edge of the cutting tool 47B in rotation is brought into contact with the bottom surface 11a of the recessed part 11. The cutting of the recessed part 11 is conducted until the insulating film 15 is cut, all the back-side electrode parts 8a are exposed and, further, the end faces of the back-side electrode parts 8a are cut evenly.

The method for cutting the recessed part 11 is not limited to the method in which the cutting implement 45B is also rotated while the wafer 1 is revolving about its own center; for instance, the cutting can also be conducted by a method in which the wafer 1 is revolved about its own center similarly to the above but the cutting implement 45B is not rotated. Specifically, while the wafer 1 revolving about its own center by rotating the chuck table 30 is moved together with the table base 35 in the Y direction, the cutting tool 47B of the cutting implement 45B in the stopped (non-rotated) state is so disposed as to pass through the center of the recessed part 11 (the center of rotation of the wafer 1). In this case, the cutting tool 47B is positioned on a straight line passing through the center of the recessed part 11 and extending in the Y direction, and the height of the cutting edge at the tip thereof is adjusted to such a position that the recessed part 11 can be cut thereby. The cutting edge of the cutting tool 47B is relatively moved from the center of the recessed part 11 to the outer peripheral edge of the recessed part 11, i.e., relatively moved in the Y direction along the radius of the recessed part 11, whereby the recessed part 11 is cut. Incidentally, since the cutting tool is not rotated in this case, the cutting outer diameter of the cutting tool does not have relation with the cutting, and, therefore, the cutting implement 45 shown in FIG. 4 can also be used.

[8] Semiconductor Chip

By the foregoing, the machining of the wafer 1 to be performed before splitting the wafer 1 into the semiconductor chips 3 is finished. Thereafter, the protective tape 10 is peeled off from the wafer 1, and the planned dividing lines 2 are cut by such means as dicing and laser, whereby all the semiconductor chips 3 are individualized. Incidentally, the splitting of the wafer 1 into the individual semiconductor chips 3 can also be carried out by a method in which each planned dividing line 2 is recognized by use of an infrared microscope on the back side of the wafer 1 with the protective tape 10 left adhered thereto, and the wafer 1 is irradiated with a laser beam along the planned dividing line 2 so as to achieve cutting. The semiconductor chips 3 obtained in the above-mentioned manner are, for example, stacked on an interposer or stacked on each other, to manufacture a stack type semiconductor package.

Figure 11:
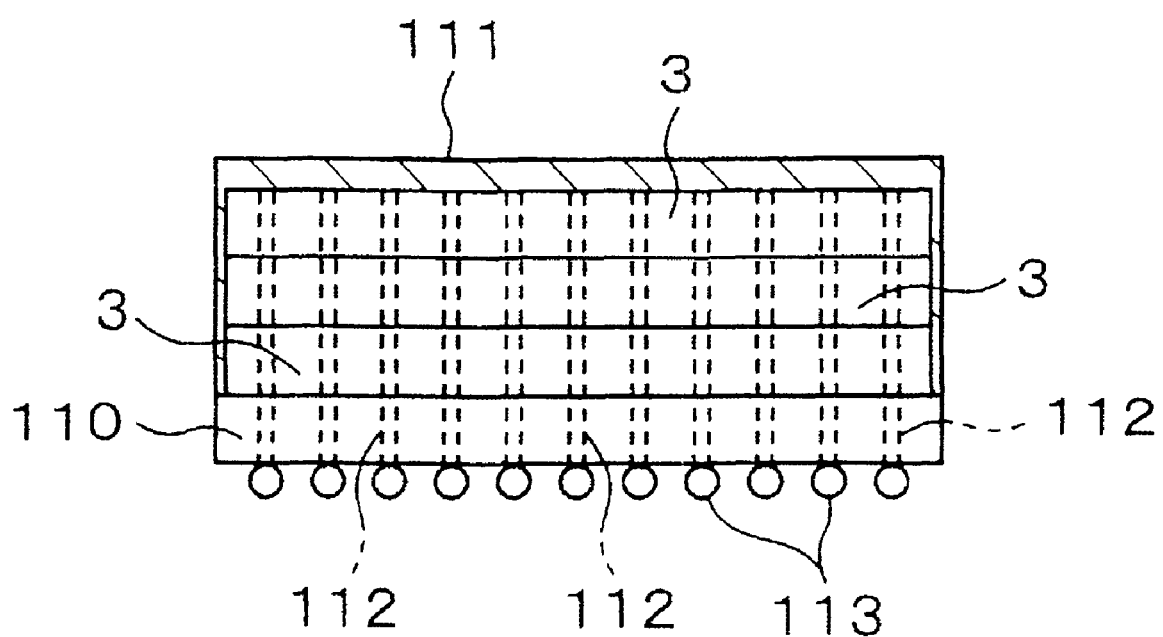
FIG. 11 is a sectional view showing an example of a semiconductor package in which semiconductor chips are stacked.

FIG. 11 illustrates an example of configuration of a semiconductor package in which the semiconductor chips 3 obtained by splitting the wafer 1 are stacked in three layers on an interposer 110 and are molded with a resin 111. The semiconductor chip 3 on the interposer 110 has its back-side electrode parts 8a crimped (press-bonded) to penetrating electrodes 112 similarly formed in the interposer 110, whereby electrical connection and fixation of the stacked state are achieved simultaneously. In addition, as for the adjacent semiconductor chips 3, the back-side electrode parts 8a of the semiconductor chip 3 on the upper side are crimped (press-bonded) to the bumps 7 of the semiconductor chip 3 on the lower side, whereby electrical connection and fixation of the stacked state are achieved simultaneously. Incidentally, the interposer 110 is provided on its back side with bumps 113 in connection with the penetrating electrodes 112, as electrical contacts for a substrate (not shown).

[9] Effects of the Embodiment

According to the method of machining a wafer in the above-described embodiment, the back side recessed part forming step is carried out by which the back-side surface portion corresponding only to the device formation region 4 needing thinning is ground to achieve the desired thinning, whereas the outer peripheral marginal region 5 in the periphery of the ground portion is left in its original thickness to form the annular projected part 12. This ensures that the device formation region 4 of the wafer 1 has been thinned and, yet, the rigidity of the wafer 1 is secured with the annular projected part 12. Therefore, handling of the wafer 1 in transfer between the processing steps subsequent to the back side recessed part forming step and in the processing steps themselves can be carried out safely and easily, and a lowering in the yield due to cracking of the wafer 1 is prevented from occurring. In addition, during the process in which the wafer 1 after the back side recessed part cutting step is split into individual semiconductor chips 3, the wafer transferring and splitting operations can also be progressed safely and easily, with the result that the productivity and the yield of the semiconductor chip are enhanced.

Besides, in the etching step, the metallic electrodes 8 are protruded from the bottom surface 11a of the recessed part 11 on the wafer back side to form the back-side electrode parts 8a, whereby the metallic electrodes 8 are made to be penetrating electrodes 8A. Then, the insulating film 15 is formed in the recessed part 11 in the subsequent insulating film forming step, and the insulating film 15 and the back-side electrode parts 8a are cut to be flat, whereby a condition where the insulating film 15 is formed in the surroundings of the back-side electrode parts 8a is obtained on the wafer back side. By this method, the back-side electrode parts 8a are exposed securely, and the insulating film 15 is formed throughout the surroundings of the back-side electrode parts 8a, resulting in that failure in conduction is securely prevented from occurring upon mounting of the semiconductor chip 3.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of machining a wafer having a substantially circular device formation region provided with a plurality of devices on a face-side surface thereof, and an outer peripheral marginal region surrounding said device formation region, said device formation region being provided with a plurality of metallic electrodes buried from face-side surfaces of devices to a depth of not less than the device thickness, said method comprising:

a protective tape adhering step of adhering a protective tape to the face side of said wafer;

a back side recessed part forming step of thinning by grinding only a region, corresponding to said device formation region, of a back-side surface of said wafer so as to form a substantially circular recessed part on said back side and to form an annular projected part projected to the back side in said outer peripheral marginal region;

an etching step of etching said recessed part so as to remove mechanical damages given to said recessed part by said grinding and to cause said metallic electrodes thus exposed to project from a bottom surface of said recessed part, thereby forming back-side electrode parts;

an insulating film forming step of coating said recessed part with a resin so as to form an insulating film; and a back side recessed part cutting step of flattening, by cutting with a cutting tool, said insulating film and said back-side electrode parts projecting from said bottom surface of said recessed part, so that said back-side electrode parts and said insulating film are flush;

wherein said cutting conducted in said back side recessed part cutting step is carried out through a process in which, while rotating said wafer with the center of said recessed part as a rotational axis, a cutting tool having a rotational axis parallel to said rotational axis of said wafer and having a rotational locus substantially equal to the radius of said recessed part is so positioned that said rotational locus coincides with said center of said recessed part, and, while rotating said wafer and said cutting tool, said cutting tool is pressed against said insulating film and said back-side electrode parts so as to achieve said cutting.

* * * * *